United States Patent [19]

Poncon

[11] Patent Number: 5,990,689
[45] Date of Patent: Nov. 23, 1999

[54] DEVICE FOR DETECTING AND LOCATING ANOMALIES IN THE ELECTROMAGNETIC PROTECTION OF A SYSTEM

[75] Inventor: Marc Robert Poncon, Marseille, France

[73] Assignee: Eurocopter, Marignane, France

[21] Appl. No.: 08/872,826

[22] Filed: Jun. 11, 1997

[30] Foreign Application Priority Data

Jun. 13, 1996 [FR] France .................................. 96 07338

[51] Int. Cl.⁶ ................................................. G01R 31/02
[52] U.S. Cl. ...................................... 324/627; 174/35 MS
[58] Field of Search ................................ 324/71.1, 71.2, 324/520, 522, 523, 527, 529, 530, 551, 627; 174/35 MS

[56] References Cited

U.S. PATENT DOCUMENTS

| H821 | 9/1990 | Hatfield et al. | 324/627 |
|---|---|---|---|
| 3,492,568 | 1/1970 | Johnson | 324/627 |
| 4,962,358 | 10/1990 | Sventanoff | 324/627 |
| 5,068,616 | 11/1991 | Broyde et al. | 324/627 |
| 5,153,524 | 10/1992 | McCormack | 324/627 |
| 5,828,220 | 10/1998 | Carney et al. | 324/627 |

FOREIGN PATENT DOCUMENTS 0 248 501  12/1987  European Pat. Off. .

*Primary Examiner*—Diep N. Do
*Attorney, Agent, or Firm*—Marshall, O'Toole, Gerstein, Murray & Borun

[57] ABSTRACT

A device for detecting and locating anomalies in the electromagnetic protection of a system including electrical bodies and protective members includes a transmitter of electromagnetic waves. Sensors protected by the protective members pick up an electromagnetic wave transmitted by the transmitter and measure a representative parameter of the wave. A central unit compares the measured values to a value corresponding to a reference state of the protection and on the basis of such comparison detects anomalies in the protection and locates an anomaly according to the suspect sensor.

17 Claims, 2 Drawing Sheets

DEVICE FOR DETECTING AND LOCATING ANOMALIES IN THE ELECTROMAGNETIC PROTECTION OF A SYSTEM

BACKGROUND OF THE INVENTION

1. Field of the Invention

The present invention concerns a device for detecting and locating anomalies in the electromagnetic protection of a system including electrical bodies and members protecting said electrical bodies and forming said electromagnetic protection.

The present invention is more particularly, although not exclusively, appropriate for a system corresponding to at least part of an aircraft such as a helicopter.

2. Description of the Prior Art

In particular, because of the increasing use in aircraft of insulative materials and materials that are poor conductors of electricity, and because of the increasing number of electrical bodies, for example cables and electrical components, that are sensitive to the electromagnetic environment, aircraft manufacturers are increasingly providing in aircraft protective members designed to protect said sensitive bodies.

These protective members are in the following forms in particular:
  shielding of electrical cables to create a direct protection, or
  means such as high frequency seals, for example, creating localized Faraday shields in the system.

Such protective members are naturally subject to wear due to mechanical and/or climatic stresses to which they are subjected, for example. This wear is known to be generally in direct proportion to the performance of said protective members.

Moreover, these protective members can be damaged by disturbances of the electromagnetic environment, for example by lightning.

Such wear and possible damage necessitates maintenance operations to maintain the minimal level of (electromagnetic) protection required for said system.

The maintenance operations as currently practiced generally consist in periodic replacement of all the protective members of the system, the prescribed replacement period being chosen so that the maximal wear assumed during that period cannot compromise the efficacy of the electromagnetic protection.

Such maintenance operations or replacements of protective members therefore do not take account of the actual state of wear of said protective members and have a two-fold disadvantage:
  firstly, all the protective members are replaced after the corresponding prescribed period of use, even if they are still serviceable, which often leads to unnecessary replacements and therefore represents an extremely high cost, and
  secondly, protective members that suddenly become defective, for example due to an abnormal level of stress or to an accident, are not replaced until the prescribed time, with the risk of this leading to extremely harmful consequences.

Various devices for detecting anomalies in the electromagnetic protection of an enclosure are known in themselves. In particular:
  document U.S. Pat. No. 5,153,524 describes a device which includes radio frequency transmitters arranged in pairs at opposite outside corners of the enclosure and a radio frequency detector situated in the interior of said enclosure which measures the sum of the energy picked up from radio frequency transmissions by each pair of transmitters, averages the values measured in this way for all of the pairs of transmitters and compares this average with a reference value to deduce any anomaly in the electromagnetic protection, and
  document EP-0 248 501 describes a device which is particularly suitable for monitoring a large enclosure and which includes means for generating and means for detecting a magnetic or electric field disposed on respective sides of the electromagnetic protection of the enclosure together with a data processing unit.

Consequently, the above prior art devices are exclusively intended to monitor a single enclosure of homogeneous construction. They cannot be used to monitor a system including a plurality of different electrical bodies and therefore cannot be used as a maintenance aid for any such system.

An object of the present invention is to remedy the above disadvantages.

SUMMARY OF THE INVENTION

The present invention concerns a low cost device for rapid and contactless detection and location of anomalies in the electromagnetic protection of a system, for example at least part of an aircraft, said device including electrical bodies, protective members for said electrical bodies and forming said electromagnetic protection, said device including at least a transmitter and a receiver of electromagnetic waves and a data processing unit, wherein:
  said transmitter includes an antenna adapted to transmit an electromagnetic wave externally of said system,
  said receiver includes a set of sensors associated with at least some of said protective members and adapted to be protected by said protective members and to measure a representative parameter of a received electromagnetic wave, and
  said data processor unit is a central unit:
    receiving the values of the parameter measured by said sensors when an electromagnetic wave is transmitted by said transmitter,
    comparing these values with a prerecorded reference value measured in a preliminary step during the transmission of an identical electromagnetic wave in a reference state of the electromagnetic protection,
    on the basis of such comparison, detecting any electromagnetic protection anomalies, and
    if necessary, locating an anomaly in accordance with the location of the sensors the measured values from which are suspect.

The expert analysis of all of the data therefore enables optimal discrimination of the suspect drifts: global protection, localized protection or variations associated with the transmitter.

According to whether these drifts relate to one or more sensors, it is possible to deduce whether the weakness affects localized protection, global protection or a drift of transmission characteristics.

Because the invention identifies electromagnetic protection anomalies by monitoring the actual state of wear of the protective members, maintenance operations can be implemented that are appropriate to this actual state of wear, which:
  reduces the cost of maintenance, since maintenance is carried out only for protective members that are actually defective, and increases safety, since all defective members are replaced, which is not the case with the prior art maintenance methods known in themselves and referred to hereinabove.

Moreover, using the invention, it is possible to locate any defective protective member directly and precisely.

Furthermore, said device of the invention has other advantages, including the following:

checking can be carried out quickly and simply, and can therefore be done as frequently and as often as required or necessary; this advantage, as well as the accuracy achieved, are due in particular to the characteristics of the data processing unit, which is implemented in the form of a unit centralizing the processing operations and which compares measured values directly, rather than by averaging measured values beforehand, as in the device described in document U.S. Pat. No. 5,153,524 previously referred to; and the checking is done without physical contact, which eliminates all risk of damaging the protective members during said checking.

The present invention is particularly suitable for a system which includes a transmitter of electromagnetic waves, for example an aircraft that carries a radio communication transmitter/receiver device, since in this case said transmitter of the system can be used to implement the invention, which leads to a reduction in cost. Said transmitter can be either an amplitude modulation transmitter or a frequency modulation transmitter, because of the absence of modulation, as explained below.

The device of the invention advantageously includes:

an alarm which is triggered when an anomaly is detected, and/or a storage unit recording the measurements carried out by said sensors, in particular for subsequent exploitation, preferably on a self-contained storage medium that can be removed from said device such as a diskette, a magnetic tape or a memory cartridge.

In accordance with the invention, said reference state of the electromagnetic protection corresponds to the state for which said protection conforms to its specifications. This can be the brand new state of said electromagnetic protection or the state resulting from a maintenance operation.

Furthermore, in one particularly advantageous embodiment of the invention said sensors, which are connected to said central unit electrically or by optical fibers, can be placed in a constant watching state in which they pick up and transmit to the central unit all measured values grater than a predetermined value and/or for which the corresponding electromagnetic waves have a transmission time greater than a predetermined time. This embodiment indicates whether the electromagnetic waves picked up are due to failure of the electromagnetic protection or to exposure of said system to an extremely severe environment, according to whether a single anomaly or multiple anomalies are detected.

In accordance with the invention, the parameter measured by said sensors is either an electrical parameter or a radio parameter.

Furthermore said central unit can advantageously include means for modifying said prerecorded reference value.

The figures of the accompanying drawing show how the invention can be put into effect. In these figures, the same reference numbers designate similar components.

DETAILED DESCRIPTION OF THE PREFERRED EMBODIMENT

Figure 1:
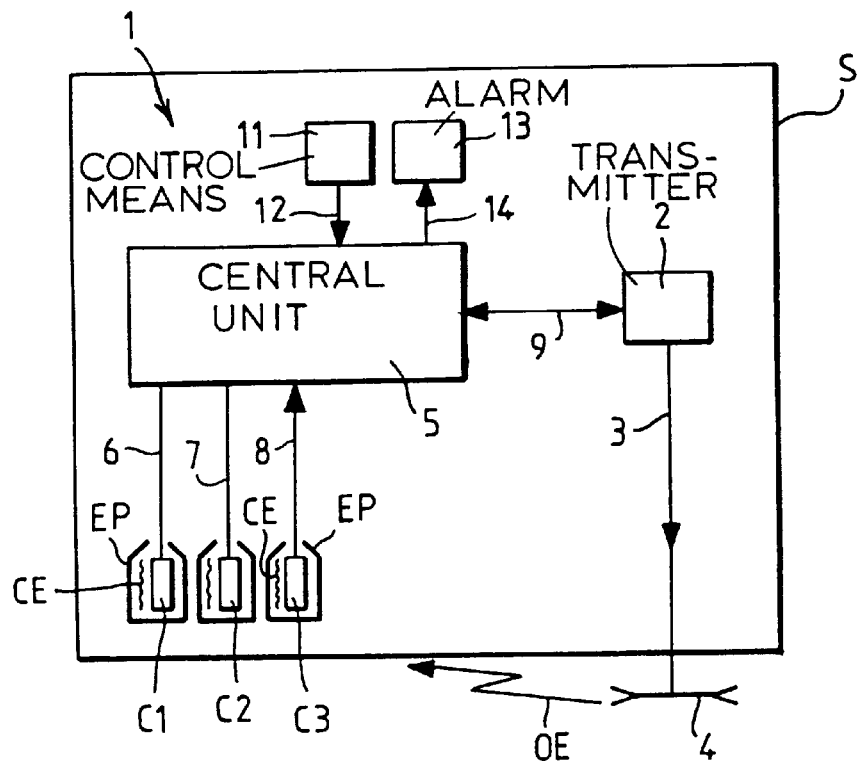
FIG. 1 is the block schematic of the device of the invention.

The device 1 of the invention shown schematically in FIG. 1 is adapted to detect and to localize anomalies in the electromagnetic protection of a system S only part of which is shown and which includes:

electrical bodies CE, and protective members EP for these electric bodies CE, forming said electromagnetic protection.

In the context of the present invention, said system S can correspond to any system having such electromagnetic protection, and in particular at least part of an aircraft such as a helicopter.

On an aircraft, said protective members EP are, for example:

the shielding of electrical cables, or means creating local Faraday shields, for example high frequency seals.

The device 1 of the invention is adapted to determine the actual state of wear of the protection members EP so that if necessary a maintenance operation can be carried out, generally by replacing defective members, that is appropriate to this actual state of wear, unlike the prior art maintenance operations in which replacement is carried out periodically, regardless of the state of wear of the members replaced.

To this end, as shown in FIG. 1, said device 1 of the invention includes:

at least one transmitter 2 of electromagnetic waves OE with an antenna 4 connected to the transmitter 2 by a connection 3 externally of the system S, for example on the structure of an aircraft if the system S represents an aircraft, and adapted to transmit electromagnetic waves OE, a set of sensors C1, C2, C3 associated with the protective members EP and adapted to be protected by said protective members EP, as shown schematically in FIG. 1, and to measure an electric or radio parameter representative of a received electromagnetic wave OE; said sensors C1 through C3 can be passive or active; they can be electric field sensors or magnetic field sensors or sensors that measure current or voltage; the bandwidth of the sensors C1 through C3 is adapted to suit the operating bandwidth of the transmitter 2, and a central unit 5 connected to said sensors C1 through C3 by respective links 6, 7 and 8, for example by electrical wires or optical fibers, and to said transmitter 2 by a link 9, said central unit 5:

receiving the values of the parameter measured by said sensors C1 through C3 when said transmitter 2 transmits an electromagnetic wave OE, comparing these values to a prerecorded reference value measured in a preliminary phase during the transmission of an identical electromagnetic wave in a reference state of the electromagnetic protection, i.e. a state in which said protection conforms to its specifications, said reference state corresponding either to the brand new state of the electromagnetic protection or to the state resulting from a maintenance operation, on the basis of such comparison, detecting any electromagnetic protection anomalies, and if necessary, locating an anomaly on the basis of the location of the sensor C1, C2 or C3 producing the suspect measured value.

The invention therefore verifies the actual state of wear of the protective members EP so that during maintenance operations all protective members that are actually defective, and only those members, can be replaced.

What is more, the actual state of wear can be verified frequently, since this is a fast and simple operation.

Moreover, this verification is done without any contact with the protective members that are checked, which prevents said protective members being damaged during such checking.

The present invention is particularly suitable for a system including a transmitter 2 of electromagnetic waves since in this case it is sufficient to provide the sensors C1 through C3 and the central unit 5 to implement the invention, which reduces the cost of the device 1.

To this end, the transmitter 2 can be a standard type radio communication transmitter/receiver device, preferably with centralized control, although only the transmit function is used in implementing the present invention.

As will be shown below, said transmitter 2 can be an amplitude modulation transmitter or a frequency modulation transmitter since no modulation is used during checking.

The device 1 of the invention further includes:

control means 11 connected by a link 12 to the central unit 5 to initiate the procedure in accordance with the invention, and an alarm 13 which is connected by a link 14 to the central unit 5 and which is triggered if an anomaly is detected by said central unit 5 so that the necessary maintenance operations can be carried out, for example immediately; in the case of an aircraft, this alarm 13 and the control means 11 can be installed in the cockpit, for example.

Moreover, in one particular embodiment, not shown, said control means 11 and said alarm 13 can additionally be on a common support.

Figure 2:
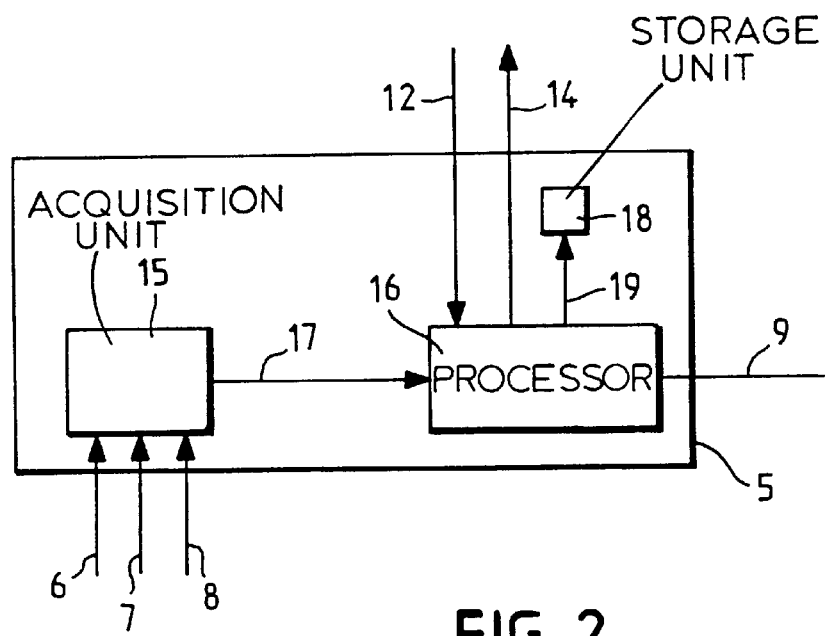
FIG. 2 is the block schematic of a central unit of the device from FIG. 1.

As can be seen in FIG. 2, said central unit 5 includes:

an acquisition unit 15 described in more detail below, a processor unit 16 also described in more detail below and connected by a link 17 to said acquisition unit 15, and a storage unit 18 connected by a link 19 to said processor unit 16.

The storage unit 18 can record all of the measurements carried out by the sensors C1 through C3 throughout the frequency band prescribed for the electromagnetic waves OE to be picked up, preferably on a self-contained storage medium that can be removed from the device 1, such as a diskette, a magnetic tape or a memory cartridge, for example, and the information stored on which can be processed afterwards by other means, not shown.

A record of this kind makes it possible to trace for each sensor C1 through C3 the amplitude of the measured values as a function of the frequency of the electromagnetic waves picked up, which provides essential information for deducing the residual service life of the protective members EP for the purposes of preventive maintenance.

The stored information can be used to schedule subsequent maintenance operations on the basis of the actual state of wear found.

Figure 3:
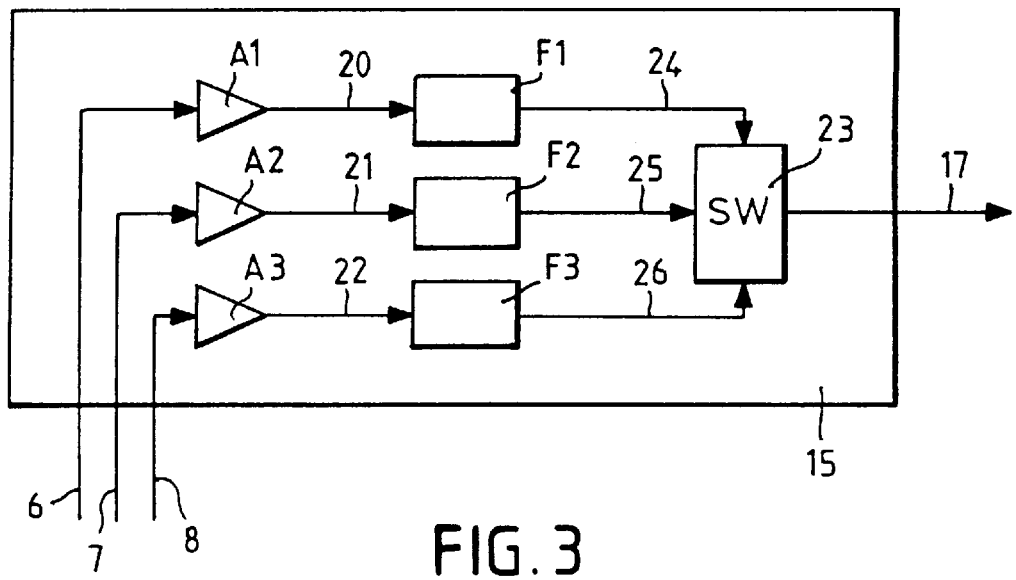
FIG. 3 is the block schematic of an acquisition unit of the central unit from FIG. 2.

As shown in FIG. 3, said acquisition unit 15 includes:

preamplifiers A1 through A3 connected to the sensors C1 through C3, respectively, high-pass filters F1 through F3 connected to said preamplifiers A1 through A3 by links 20, 21 and 22 and adapted in particular to eliminate the operating noise of the system S; the cut-off frequency of said filters F1 through F3 is as high as possible, according to the frequency band prescribed for the electromagnetic waves OE transmitted by said transmitter 2, and a switch 23 which is connected to said filters F1 through F3 by respective links 24 through 26 and which enables the measurements carried out by all of the sensors C1 through C3 to be processed simultaneously.

Figure 4:
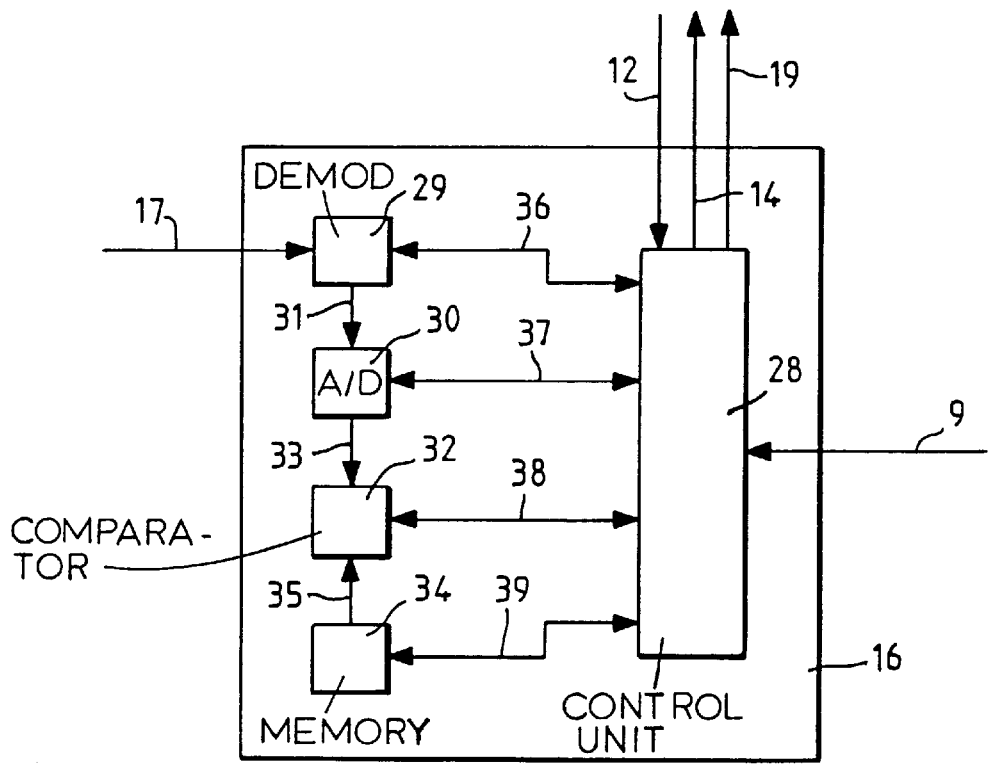
FIG. 4 is the block schematic of a data processing unit of the central unit from FIG. 2.

As shown in FIG. 4, the processor unit 16 includes:

a control unit 28 which controls the various processing operations, a demodulator system 29 to demodulate the signals received from the acquisition unit 15 in order to retain only the continuous component, an analog/digital converter 30 converting the signals received from said system 29 over a link 31, and a comparator 32 which performs the previously mentioned comparisons between the measured values received from the converter 30 over the link 33 and said reference value received from a memory 34 over a link 35, there being provision for modification of said reference value by the control unit 28 or by other means, not shown.

Said control unit 28 is responsible for synchronizing the various acquisition, calculation and control steps of the procedure in accordance with the present invention.

To this end, the management unit 28 is connected by links 36 through 39 to said members 29, 30, 32 and 34.

Depending on the technology employed, the positions of the switch 23 and the demodulator system 29 can be interchanged in the architecture of the central unit 5.

In accordance with the invention, said sensors C1 through C3 can be put into a constant watching state in which they pick up all measured values exceeding a predetermined value or for which the transmission time is greater than a predetermined time and transmit them to the central unit 5 for storage in the memory 18. In this particular embodiment an event counter, not shown, can be provided and incremented each time any such signal is detected.

When the system S is shut down, the presence of these stored signals can initiate verification to determine if they result from a failure of the electromagnetic protection or merely from exposure of the system S to an environment that is extremely unfavorable from the electromagnetic point of view or even to an environment more severe than that for which the system S was designed.

Note also that if said system S includes a computer, not shown, for global monitoring of the status of said system, said central unit 5 can be directly integrated into this computer.

In accordance with the invention, means may additionally provided in said central unit 5 for automatically initiating the procedure in accordance with the invention, for example periodically and/or each time the system S is shut down.

There is claimed:

1. A device for detecting anomalies in electromagnetic protection, comprising:

a plurality of electrical bodies;

a plurality of protective members, each of said protective members providing electromagnetic protection for one of said electrical bodies;

a transmitter of electromagnetic waves, said transmitter including an antenna that transmits electromagnetic waves externally of said protective members;

a plurality of sensors associated with said protective members, each of said sensors being protected by one of said protective members and each of said sensors measuring a parameter of a test electromagnetic wave transmitted by said transmitter; and a data processing unit that receives a plurality of values of said parameter measured by said sensors when said test electromagnetic wave is transmitted by said transmitter, said data processing unit comparing each of said values with a prerecorded reference value measured during a previous transmission of a reference electromagnetic wave transmitted by said antenna when said protective members are in a reference state, said central data processing unit detecting an electromagnetic protection anomaly based on said comparison of each of said values with said prerecorded reference value.

2. A device as claimed in claim 1, wherein said data processing unit determines a location of said electromagnetic anomaly.

3. A device as claimed in claim 1, wherein an alarm is triggered if an anomaly is detected.

4. The device claimed in claim 1, wherein said data processing unit includes a storage unit recording measurements carried out by said sensors.

5. The device claimed in claim 4, wherein said storage unit records on a selfcontained storage medium that can be removed from said device.

6. The device claimed in claim 1, wherein said reference state corresponds to the state of said protective devices when said protective devices are new.

7. The device claimed in claim 1, wherein said reference state corresponds to the state of said protective devices resulting from a maintenance operation.

8. The device claimed in claim 1, wherein said sensors continually monitor said protective members and transmit to said data processing unit all measured values which are greater than a predetermined value.

9. The device claimed in claim 1, wherein said sensors continually monitor said protective members and transmit to said data processing unit all measured values generated from electromagnetic waves with transmission times greater than a predetermined time.

10. The device claimed in claim 1, wherein said sensors are electrically connected to said data processing unit.

11. The device claimed in claim 1, wherein said sensors are connected to said data processing unit by optical fibers.

12. The device claimed in claim 1, wherein said parameter measured by said sensors comprises an electrical parameter.

13. The device claimed in claim 1, wherein said parameter measured by said sensors comprises a radio parameter.

14. The device claimed in claim 1, wherein said transmitter comprises an amplitude modulation transmitter.

15. The device claimed in claim 1, wherein said transmitter comprises a frequency modulation transmitter.

16. The device claimed in claim 1, wherein said data processing unit includes means for modifying said prerecorded reference value.

17. The device claimed in claim 1, wherein said electrical bodies and said protective members are mounted to an aircraft.

* * * * *